(12) United States Patent
Jung

(10) Patent No.: US 7,793,671 B2
(45) Date of Patent: Sep. 14, 2010

(54) APPARATUS FOR AND METHOD OF CLEANING SUBSTRATES

(75) Inventor: Jae-Hyung Jung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 840 days.

(21) Appl. No.: 11/646,540

(22) Filed: Dec. 28, 2006

(65) Prior Publication Data

US 2007/0181164 A1    Aug. 9, 2007

(30) Foreign Application Priority Data

Feb. 6, 2006    (KR) ...................... 10-2006-0011325

(51) Int. Cl.
  *B08B 3/00* (2006.01)
  *B08B 3/02* (2006.01)
  *B08B 3/04* (2006.01)

(52) U.S. Cl. ..................... 134/137; 134/94.1; 134/95.1; 134/198; 134/95.3; 134/140; 134/33; 134/34; 134/902

(58) Field of Classification Search ............... 134/26, 134/32, 33, 34, 36, 902, 94.1, 95.1, 95.2, 134/95.3, 137, 140, 198, 199
See application file for complete search history.

(56) References Cited

U.S. PATENT DOCUMENTS 3,760,822 A * 9/1973 Evans ......................... 134/99.1
5,672,212 A * 9/1997 Manos ......................... 134/1.3
2002/0078980 A1* 6/2002 Kamikawa ................... 134/133
2003/0221713 A1* 12/2003 Egashira ...................... 134/149

FOREIGN PATENT DOCUMENTS

| JP | 08-008222 | 1/1996 |
|----|-----------|--------|
| JP | 2001-044106 | 2/2001 |
| KR | 1020040069452 A | 8/2004 |
| KR | 1020040080831 A | 9/2004 |

* cited by examiner

*Primary Examiner*—Alexander Markoff
(74) *Attorney, Agent, or Firm*—Volentine & Whitt, PLLC

(57) ABSTRACT

An apparatus for cleaning substrates includes a substrate support that is configured to support a plurality of substrates horizontally as spaced regularly one above the other, a rotating device for rotating the substrate support and a liquid supply system for dispensing cleaning liquid onto the substrates. The substrate support has a base plate and support rods extending upright on the base plate. The support rods include fixed rods and at least one movable rod. The movable rods is movable between an open position to provide a passage that allows the substrates to be placed between the support rods, and a closed position at which the substrates are held by and between the support rods. Once the substrates are supported in this way, the substrates are rotated. Then, the cleaning liquid, such as a chemical solution(s) followed by a rinsing liquid, is dispensed onto all of the substrates as the substrates are being rotated.

11 Claims, 19 Drawing Sheets

910

920

APPARATUS FOR AND METHOD OF CLEANING SUBSTRATES

BACKGROUND OF THE INVENTION

1. Field of the Invention

The present invention relates to the manufacturing of semiconductor devices and the like. More particularly, the present invention relates to an apparatus for and to a method of cleaning substrates such as semiconductor wafers.

2. Description of the Related Art

Generally, semiconductor devices are manufactured by subjecting a wafer repeatedly to deposition, photolithography, etching, polishing, and cleaning processes to form patterns, e.g., circuit patterns, on the wafer. The cleaning process is performed after each of the other processes to remove residual chemicals, small particles, contaminants, or unnecessary layers from the wafer. The importance of the cleaning process has increased as the patterns formed on today's semiconductor wafers have become finer and finer.

A process of cleaning a semiconductor wafer includes treating the wafer with a chemical solution (chemical treatment) to etch away or strip contaminants from the semiconductor wafer, rinsing the chemically treated semiconductor wafer with deionized water, and drying the rinsed semiconductor wafer.

Conventional cleaning apparatuses include, as shown in FIG. 1, a spin dryer 910 in which a single wafer is dried using a centrifugal force and, as shown in FIG. 2, a batch dryer 920 in which a plurality of wafers are dipped into cleaning liquid. Although the spin dryer 910 shown in FIG. 1 can dry a wafer with a high degree of efficiency, the spin dryer 910 imposes a significant limit on the productivity of the semiconductor device manufacturing process because the spin dryer 910 only dries one wafer at a time. On the other hand, although the batch dryer 920 shown in FIG. 2 can provides a high throughput, wafers in the batch can be easily contaminated by contaminants present on other wafers in the batch. In addition, the batch dryer 920 cannot clean wafers to the desired extent or with the desired uniformity.

SUMMARY OF THE INVENTION

An object of the present invention is to provide a substrate cleaning apparatus that can clean substrates effectively and quickly. Likewise, an object of the present invention is to provide an efficient and productive method of cleansing substrates.

According to one aspect of the present invention, an apparatus for cleaning substrates includes a substrate support configured to support a plurality of substrates horizontally as spaced vertically one above the other, a rotating device for rotating the substrate support about a vertical axis, and a liquid supply system that dispenses cleaning liquid onto all of the substrates supported by the substrate support.

The substrate support may include a base plate that is rotated by the rotating device, and at least three support rods extending upright on the base plate. The support rods hold the substrates by their edges during a cleaning process. Preferably, each of the support rods defines a plurality of grooves spaced along the length thereof for receiving outer peripheral portions of the substrates. Each of the grooves may be annular. Also, at least one of the support rods is a fixed rod (fixed in place relative to the base plate), and at least one of the support rods is a movable rod. The movable rod(s) is/are movable relative to the base plate between an open position to provide a passage through which the substrates can be inserted into a space between the support rods and a closed position at which the passage is closed off and the substrates are engaged by the support rods. To this end, the substrate support also includes a position adjusting device operative to move the at least one movable rod between the open and closed positions thereof.

The position adjusting device may include a horizontal rod having one end to which the movable rod is coupled, a vertical rod fixed to the other end of the horizontal rod, and a driving mechanism operatively connected to the vertical rod so as to rotate the vertical rod about its longitudinal axis. The horizontal rod extends in a radial direction of the base plate. Also, the movable rod may be coupled to the horizontal rod such that the movable rod is rotatable about its longitudinal axis.

The base plate of the substrate support may have a sector-shaped guide portion in which the horizontal rod is disposed. The sector-shaped guide portion is delimited by two walls of the base plate extending in radial directions of the base plate, respectively. The range over which the horizontal rod can be rotated is restricted to the angle subtended by these walls.

The rotating device may include a vertical cylindrical shaft fixed to the base plate, and a driving mechanism operatively connected to the cylindrical shaft so as to rotate the shaft about its longitudinal axis. In this case, the vertical rod of the position adjusting device extends through the cylindrical shaft.

The liquid supply system may include a plurality of nozzles disposed at different heights. The nozzles are oriented to respectively eject cleaning liquid toward central portions of the substrates supported by the substrate support. Also, the liquid supply system may be made up of at least one chemical solution supply sub-system that supplies a chemical solution onto all of the substrates supported by the substrate support, and at least one rinsing liquid supply system that supplies rinsing liquid onto all of the substrates supported by the substrate support.

The cleaning apparatus may also include a tub that is large enough to accommodate the substrate support, and a lifting device for moving the tub and the substrate support relative to each other. In particular, the substrate support can be located within the tub so that the tub provides a room in which the cleaning process takes place, and the substrate support can be located outside of the tub to facilitate the loading/unloading of the substrates onto/from the substrate support. In the case in which the cleaning apparatus includes a tub, the nozzles of the liquid supply system may extend through the tub. Also, the liquid supply system may include a manifold(s) disposed outside the tub and from which the nozzles extend into the tub.

According to another aspect of the present invention, a method of cleaning substrates includes supporting a plurality of substrates with the substrates oriented horizontally and spaced vertically one above the other, rotating the substrates while the substrates are supported as oriented horizontally and spaced vertically one above the other, and dispensing cleaning liquid onto all of the substrates as the substrates are being rotated. The substrates may be supported by gripping the substrates with at least three vertically extending support rods. At least one of the support rods is moved to an open position to provide a passage between two of the rods. The passage is wider than the diameter of the substrates. The substrates are then inserted, as oriented horizontally, through the passage and into a space between the support rods. The movable rod(s) is then moved to a closed position at which the passage is narrower than the diameter of the substrates and hence, the substrates are confined between the support rods.

The cleaning liquid that is dispensed may include at least one chemical solution and a rinsing solution. That is, the substrates are chemically treated by directing a chemical solution towards central portions of the respective substrates. Subsequently, the chemical solution is rinsed off of the substrates by directing rinsing liquid towards central portions of the respective substrates. Finally, the substrates may be dried by terminating the dispensing of the rinsing liquid and thereafter rotating the substrates.

BRIEF DESCRIPTION OF THE DRAWINGS

These and other objects, features and advantages of the present invention will become clearer from the following detailed description of the preferred embodiments thereof made with reference to the attached drawings, in which like reference numerals designate like parts throughout. In the drawings.

DETAILED DESCRIPTION OF PREFERRED EMBODIMENTS

Figure 1:
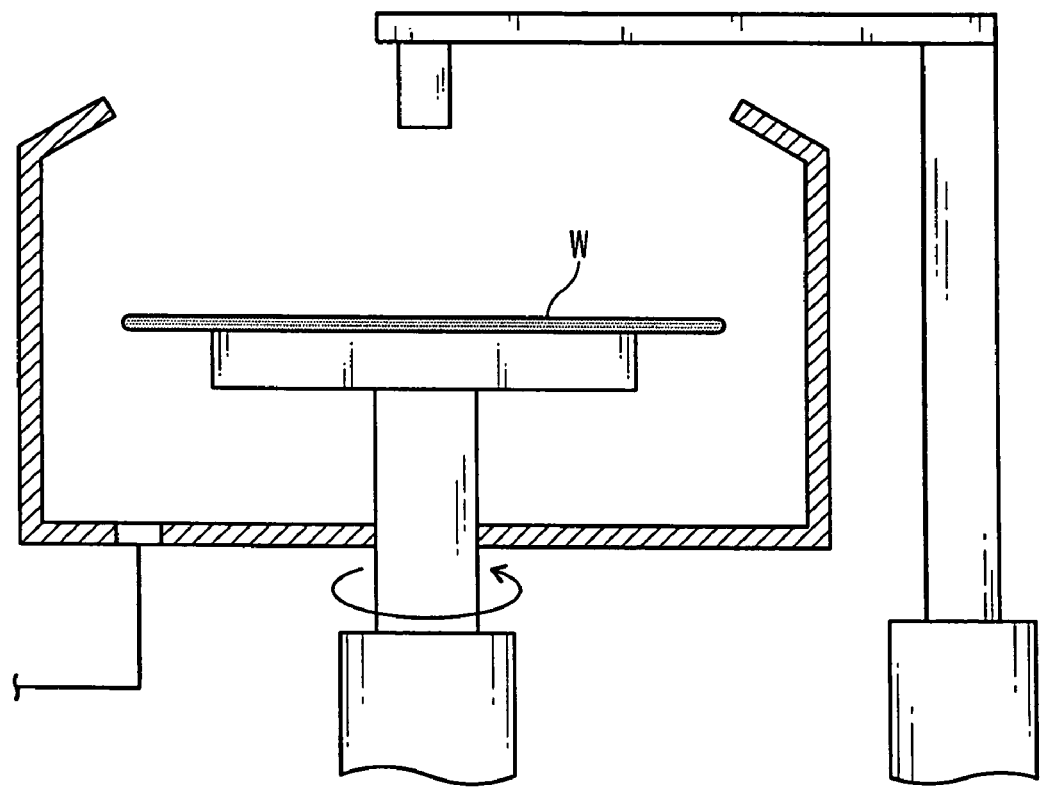
FIG. 1 is a side view, partially in section, of a conventional single wafer type cleaning apparatus.
Figure 2:
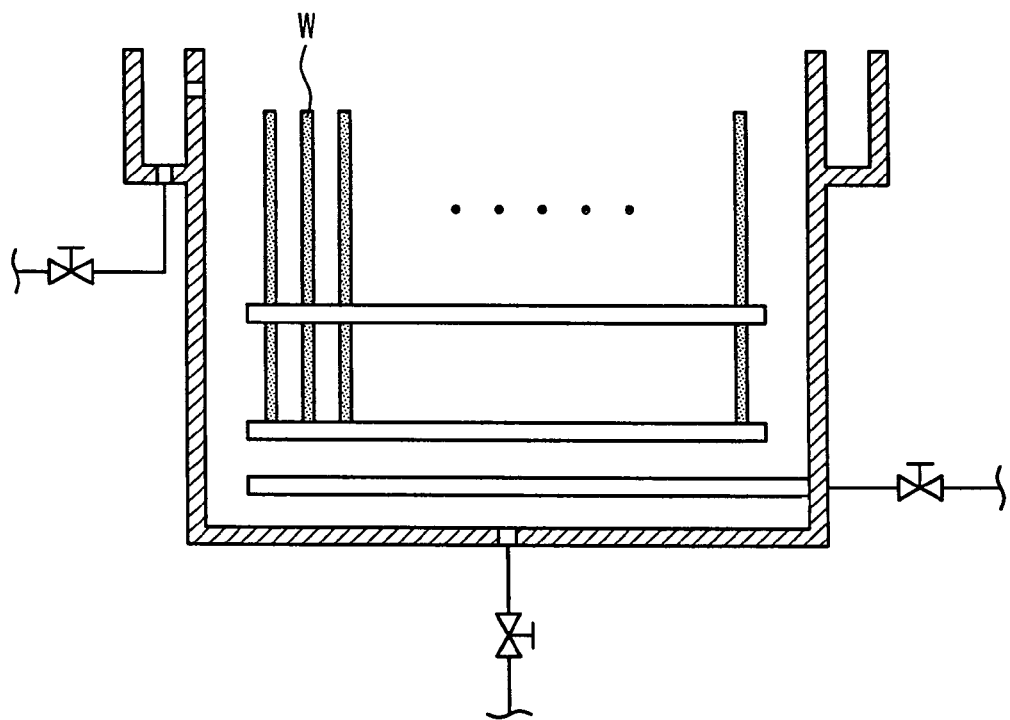
FIG. 2 is a side view, partially in section, of a conventional batch cleaning apparatus.

Preferred embodiments of the present invention will be described below in more detail with reference to FIGS. 3 through 16. Note, though, the shapes of elements may be exaggerated in the drawings for the sake of clarity.

Figure 3:
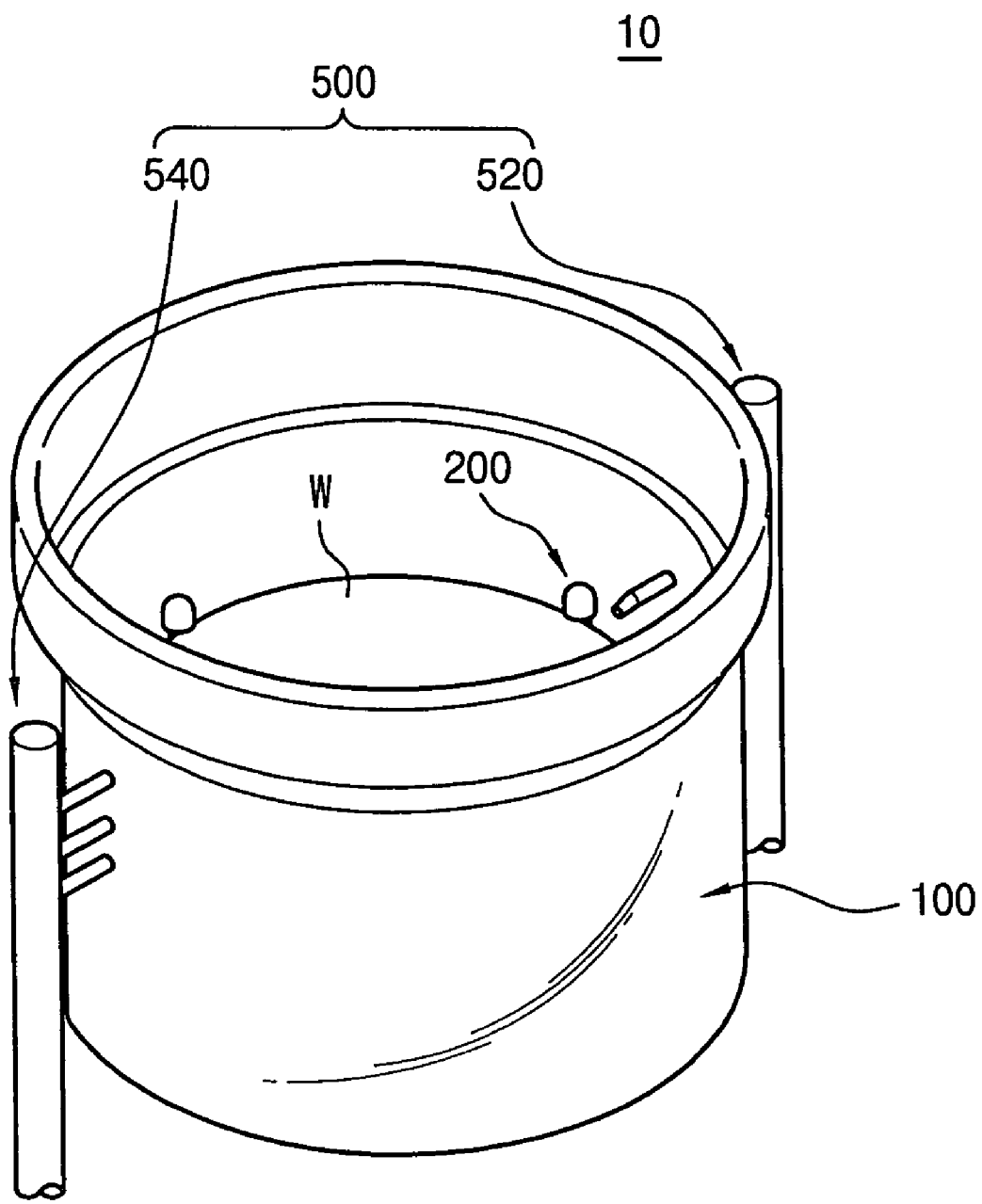
FIG. 3 is a perspective view of part of a substrate cleaning apparatus according to the present invention.
Figure 4:
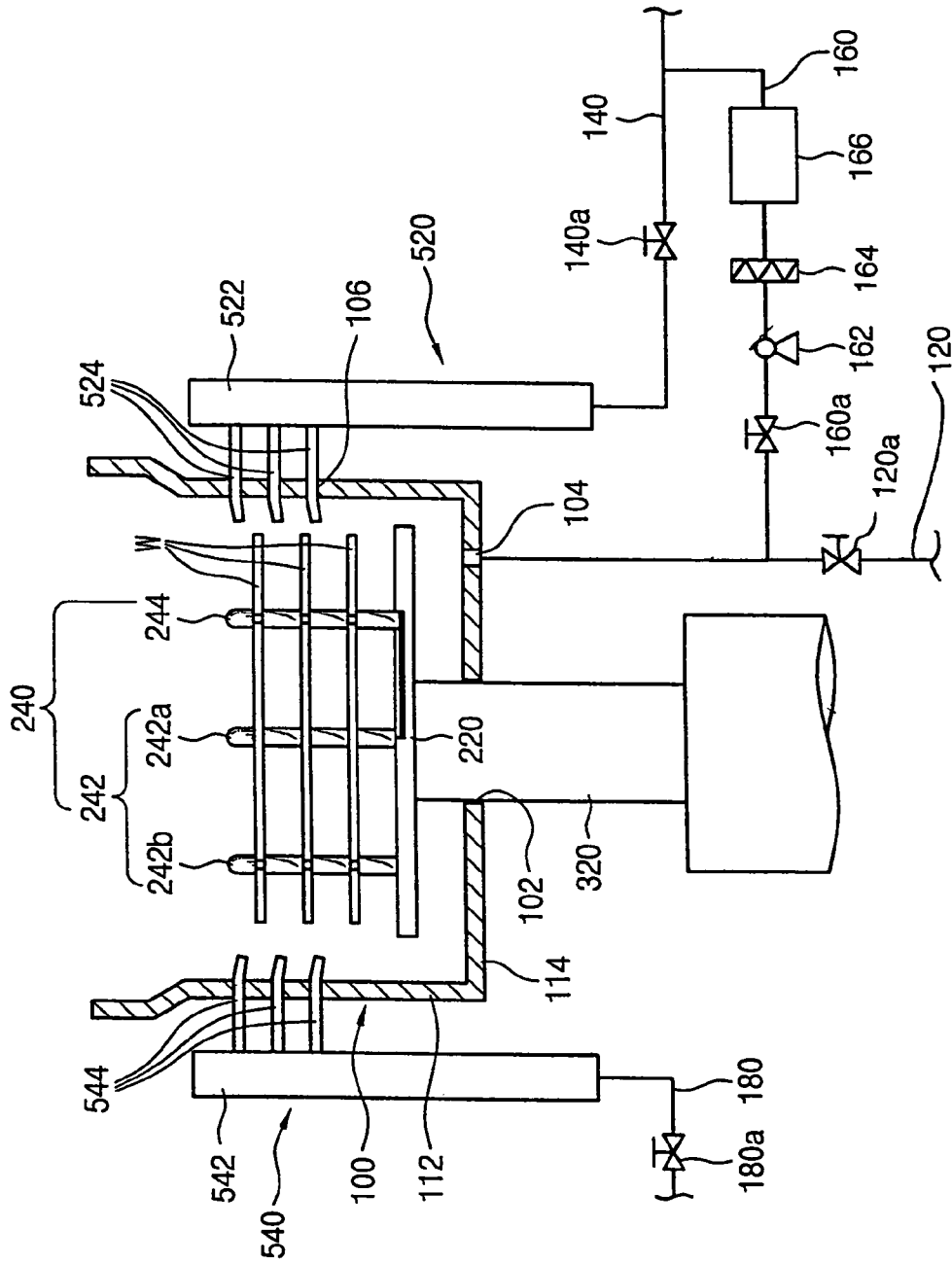
FIG. 4 is a side view, partially in section, of the substrate cleaning apparatus according to the present invention.
Figure 8:
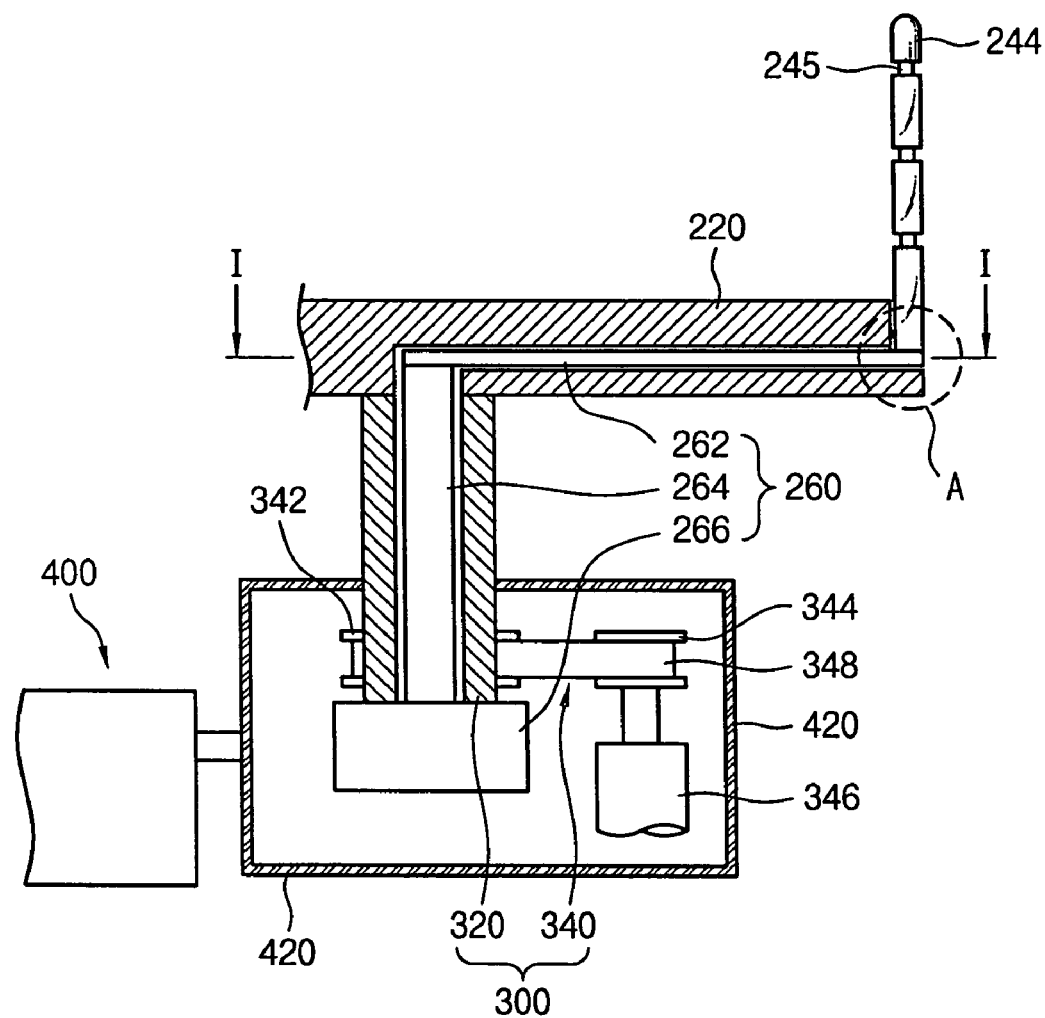
FIG. 8 is a side view, partially in section, of part of the substrate cleaning apparatus according to the present invention.

Referring to FIGS. 3, 4 and 8, a substrate cleaning apparatus 10 according to the present invention includes a tub 100, a substrate support 200, a rotating device 300, a lifting device 400, and a liquid supply system 500. The tub 100 provides a space in which substrates are cleaned. The substrate support 200 is configured to support substrates such as wafers (W). During a cleaning process, the substrate support 200 is disposed in the tub 100 to support substrates such as wafers (W) in the tub. Also, during this time, the rotating device 300 rotates the substrate support 200 on which the wafers (W) are supported, and the liquid supply system 500 sprays cleaning liquid onto the wafers (W) supported on the substrate support 200. The lifting device 400 moves the substrate support 200 up and down between a lowered position at which the substrate support 200 is situated in the tub 100 and a raised position at which the substrate support 200 protrudes from the tub 100. The elements of the substrate cleaning apparatus 10 will now be more fully described.

The tub 100 has an open top and comprises a sidewall 112 and a bottom wall 114. The sidewall 112 has openings through which nozzles 524 and 544 of the liquid supply system 500 extend. The bottom wall 114 has a through-hole 102 at the center thereof and through which a shaft 320 of the rotating device 300 extends. Also, a drain hole 104 extends through an outer peripheral portion of the bottom wall 114. Used cleaning liquid is discharged from the tub 100 through the drain hole 104. A drain line 120 is connected to the drain hole 104, and a valve 120a is disposed in the drain line 120 to selectively open and close the drain line 120.

Figure 5:
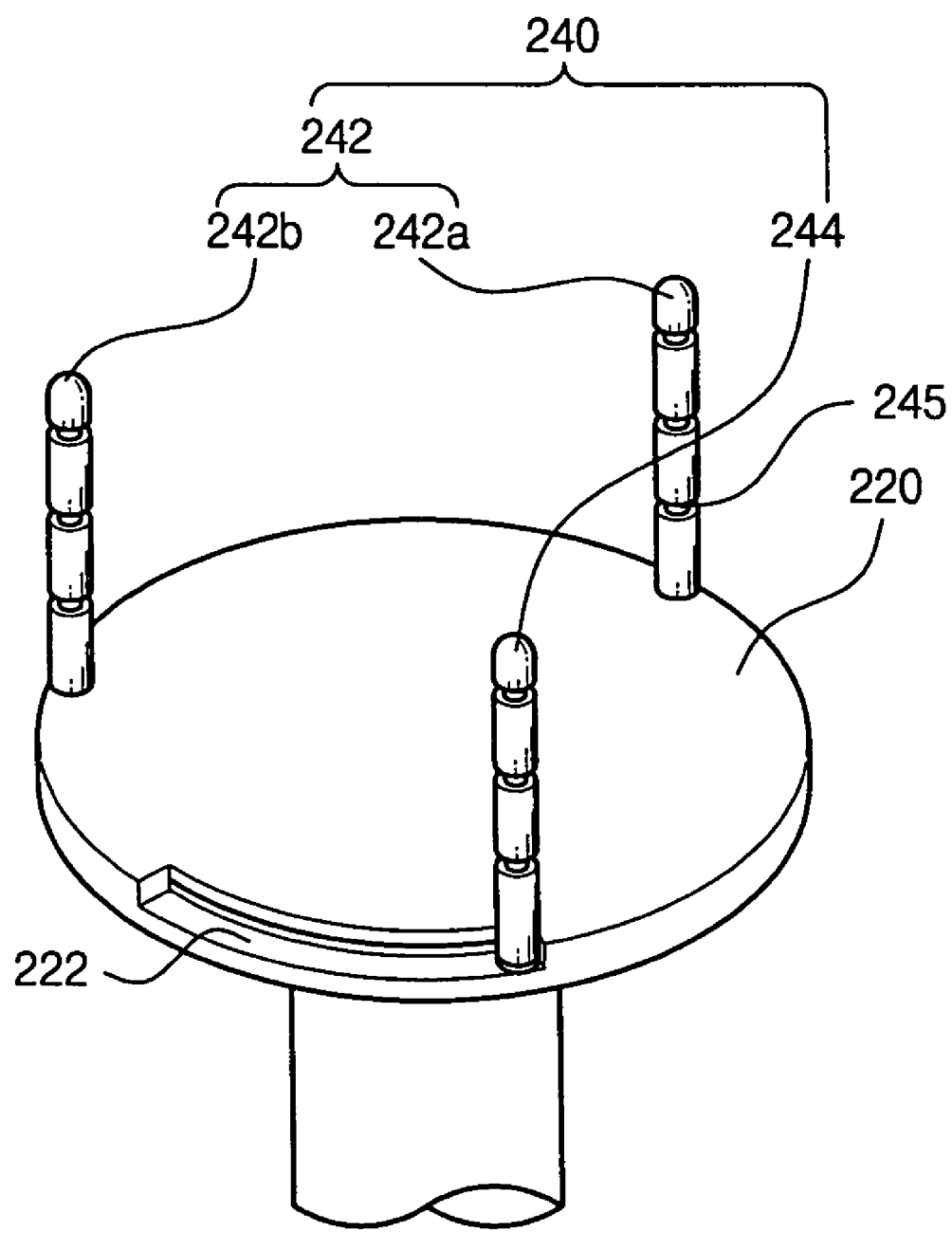
FIG. 5 is a perspective view of a substrate support of the substrate cleaning apparatus according to the present invention.

Referring to FIGS. 5 and 8, the substrate support 200 includes a base plate 220, support rods 240, and a position adjusting device 260 (refer to FIG. 8). The base plate 220 is circular, and the support rods 240 are disposed along the periphery of the base plate 220. More specifically, the support rods 240 include a plurality of fixed rods 242 fixed to the base plate 220 and at least one movable rod 244 movable relative to the base plate 220. The fixed rods 242 and the movable rod 244 can be spaced a predetermined distance from each other along the periphery of the base plate 220 to accommodate wafers (W) therebetween.

The fixed rods 242 are elongated and extend vertically from the base plate 220. Each of the fixed rods 242 has a plurality of annular grooves 245 extending circumferentially in the outer surface thereof. The annular grooves 245 of each fixed rod 242 are spaced at a predetermined distance from each other along the length of the fixed rod 242. The grooves 245 are each wide enough to accommodate a wafer (W) at its outer peripheral edge.

Each movable rod 244 has substantially the same shape as the fixed rods 242. The movable rod 244 is movable relative to the base plate 220 between an open position and a closed position. When the movable rod 244 is in the open position, wafers (W) can be inserted into the space between the fixed rods 242 and the movable rod 244. The movable rod 244 can then be moved to the closed position, whereby the wafers (W) are held firmly between the fixed rods 242 and the movable rod 244. Thus, the wafers (W) are supported by the supporting rods 240 as spaced a predetermined distance from each other, and with patterned surfaces of the wafers (W) facing upward. The centers of wafers (W) supported by the support rods 240 are aligned with the center of the base plate 200.

Figure 6:
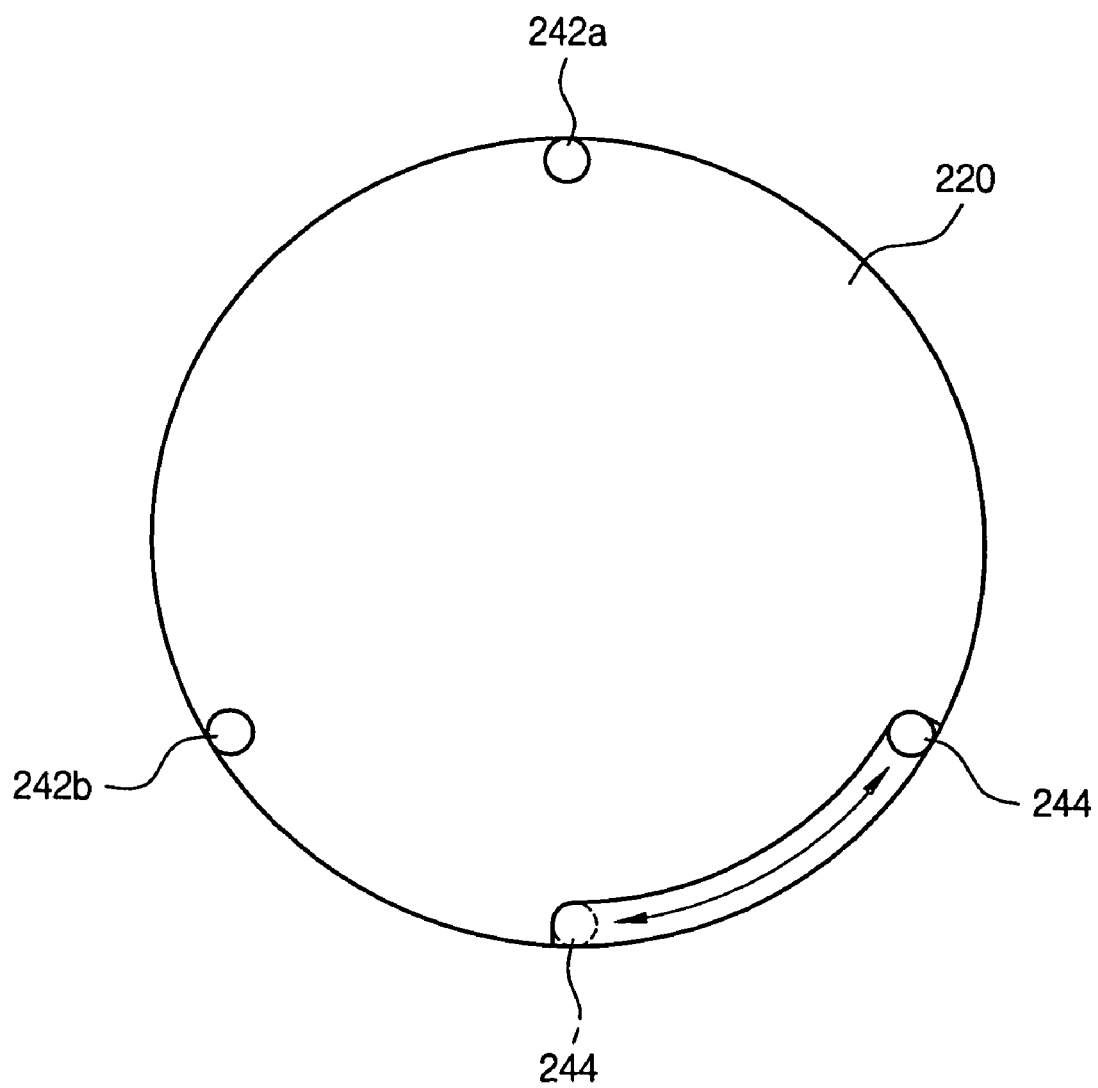
FIG. 6 is a plan view of the substrate support.

Referring to FIGS. 6 and 8, the movable rod 244 is movable by the position adjusting device 260 within a predetermined range in the circumferential direction of the base plate 220. In the embodiment shown in FIG. 6, two (first and second) fixed rods 242a and 242b and one movable rod 244 are provided. When the movable rod 244 is in the open position (shown by the dashed lines), the fixed rods 242a and 242b and the movable rod 244 are approximately located at the vertices of a right triangle, respectively. When the movable rod 244 is in the closed position (shown by the solid lines), the fixed rods 242a and 242b and the movable rod 244 are approximately located at the vertices of a regular (equilateral) triangle. More particularly, the first and second fixed rod 242a and 242b subtend an angle of 120 degrees with the center of the base plate 220, and the movable rod 244 is substantially aligned with the first fixed rod 242a and the center of the base plate 220 when the movable rod 244 is in the open position. The movable rod 244 is rotated approximately 60 degrees about the center of the base plate 220 in a direction away from the second fixed rod 242b to move the movable rod 244 from the open position to the closed position.

A wafer (W) can be stably supported on the support rods 240 when the movable rod 244 is in the open position because the outer peripheral portion of the wafer (W) is supported at three places by the support rods 240. The fixed rods 242a and 242b and the movable rod 244 are arranged at equiangular intervals after the movable rod 244 is moved to the closed position in preparation for the wafer (W) to undergo a cleaning process. Thus, the wafer (W) is most stably supported by the support rods during the cleaning process.

Figure 7:
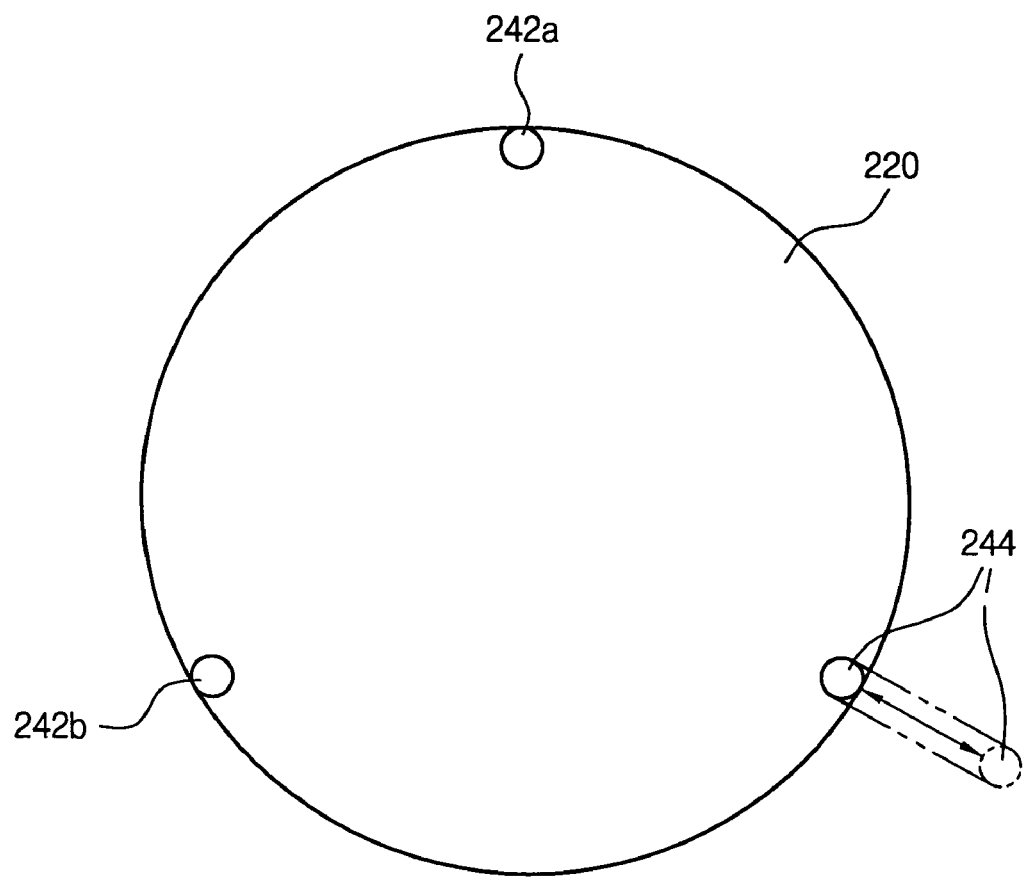
FIG. 7 is a plan view of another embodiment of the substrate support.

The support rods 240 can be arranged in ways other than that shown in FIG. 6 as long as wafers (W) can be placed between the support rods 240 without interference and stably held by the support rods 240 during a cleaning process. For example, as shown in FIG. 7, the movable rod 244 can be spaced a predetermined distance from the outer edge of the base plate 220 when the movable rod 244 is in its open position (shown by the dashed lines), and can be moved inwardly in a radial direction of the base plate 220 to its closed position (shown by the solid lines).

Furthermore, the number of fixed and movable rods can be different from those in the present embodiment as shown in FIG. 6. Also, although each of the fixed rods 242 and the movable rod 244 has three grooves 245 in the present embodiment as shown in FIG. 5, so that three wafers (W) can be supported by the substrate support 200 at once, the present invention is not so limited. Rather, two, four, or more grooves 245 can be formed in each of the fixed rods 242 and the movable rod 244, so that the substrate support 200 can support two, four, or more wafers (W) at once.

As mentioned above, the rotating device 300 rotates the substrate support 200 during a cleaning process to rotate wafers (W) held by the substrate support 200. Referring to FIG. 8, the rotating device 300 includes a shaft 320 fixed to a central portion of the backside of the base plate 220, and a driving unit 340 for rotating the shaft 320. The shaft 320 is cylindrical. The driving unit 340 may include a first pulley 342, a second pulley 344, a motor 346, and a belt 348. The first pulley 342 is fitted around the shaft 320, and the second pulley 344 is coupled to the motor 346. The belt 348 is wound around the first and second pulleys 342 and 344. Therefore, driving power can be transmitted from the motor 346 to the shaft 320.

The position adjusting device 260 moves the movable rod 244 between its open and closed positions. The position adjusting device 260 includes a horizontal rod 262, a vertical rod 264, and a driving mechanism 266. The driving mechanism may comprise a motor such as an electric motor. The horizontal rod 262 extends, e.g., in a radial direction of the base plate 220. The movable rod 244 is coupled to an end of the horizontal rod 262. The movable rod 244 extends upward from the end of the horizontal rod 262. The vertical rod 264 is coupled to the other end of the horizontal rod 262 and extends downward from the other end of the horizontal rod 262. The vertical rod 264 is rotated by the driving mechanism 266. Thus, when the vertical rod 264 is rotated, the horizontal rod 262 and the movable rod 244 are rotated together about the axis of rotation of the vertical rod 264.

Figure 9:
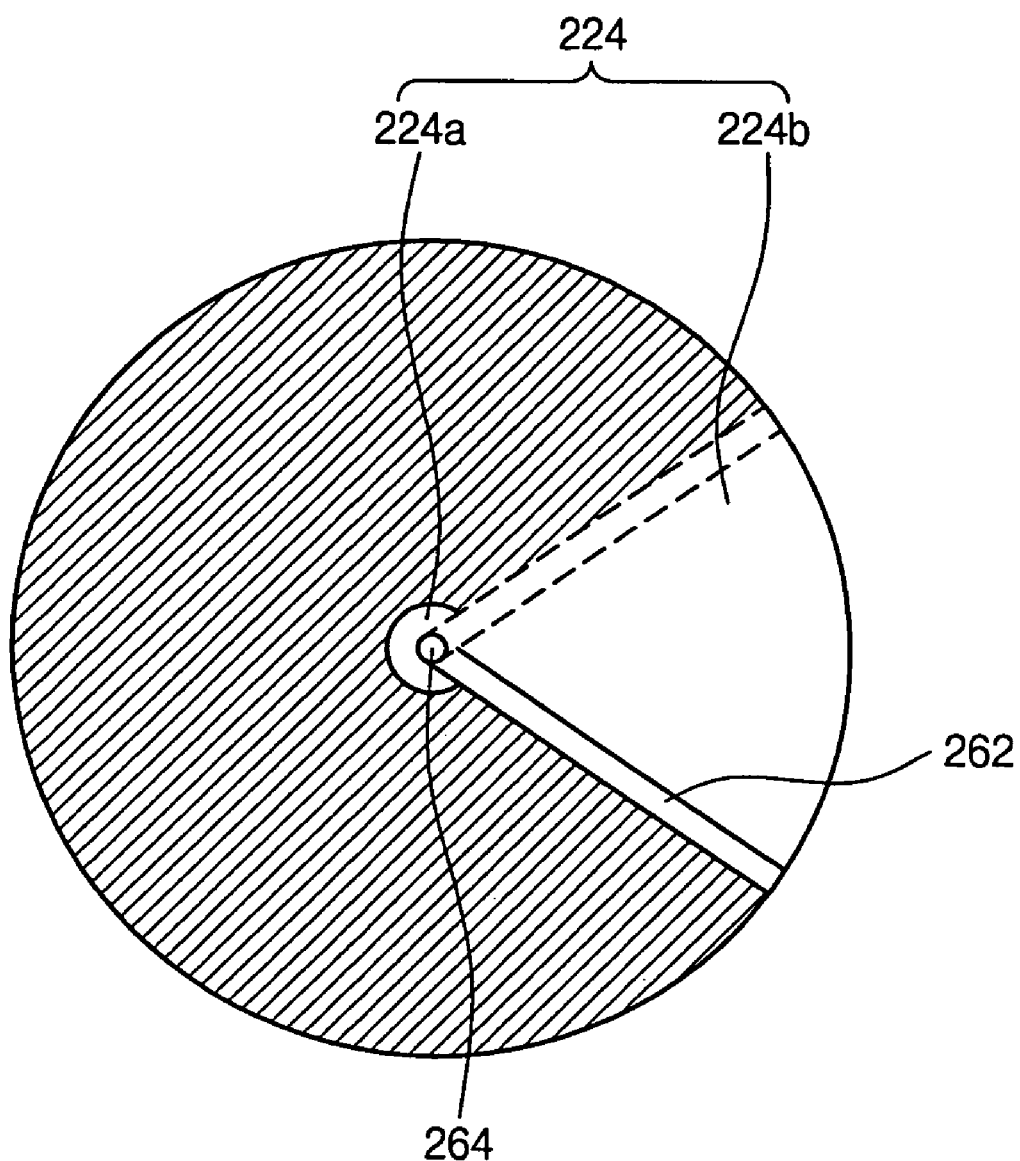
FIG. 9 is a sectional view taken along line I-I of FIG. 8.

Referring to FIGS. 8 and 9, the vertical rod 264 extends through the cylindrical shaft 320 of the rotating device 300 for rotating the substrate support 200. The base plate 220 of the substrate support 200 has a guide portion 224 defined by a cavity in the base plate 220, for example, that accommodates the horizontal rod 264 and allows the horizontal rod 264 to rotate therein. Referring to FIG. 9, the cavity of the base plate 220 has a circular central portion 224a and a sector-shaped portion 224b. The central portion 224a is open the interior of the cylindrical shaft 320, and the guide portion 224b extends from the central portion 224a to one side of the base plate 220. The guide portion 224b has an included angle corresponding to the angle over which the horizontal rod 264 is moved by the position adjusting device 260.

That is, the base plate 220 has a sector-shaped guide portion delimited by two walls of the base plate 220 extending in radial directions of the base plate, respectively. The range over which the horizontal rod 262 can be rotated is restricted to the angle subtended by these walls such that the movable rod 244 can be moved only between the open and closed positions. The included angle of the sector-shaped guide portion is about 60 degrees.

Referring to FIG. 5, the base plate 220 has an arcuate groove 222 in an outer peripheral portion of the upper surface thereof and to which the guide portion 224b extends. The movable rod 244 extends upwardly from the horizontal rod 262 within the arcuate groove 222. Thus, when the movable rod 244 is in the open position, the horizontal rod 262 contacts an inner wall of the base plate 222 that defines one side of the guide portion 224b (solid lines in FIG. 9). On the other hand, when the movable rod 244 is in the closed position, the horizontal rod 262 contacts an inner wall of the base plate 222 that defines the other side of the guide portion 224b (dashed lines in FIG. 9). Accordingly, the movable rod 244 is moved smoothly along the edges of wafers, i.e., does not damage the wafers, when the movable rod 244 is moved between the open and closed positions.

Figure 10:
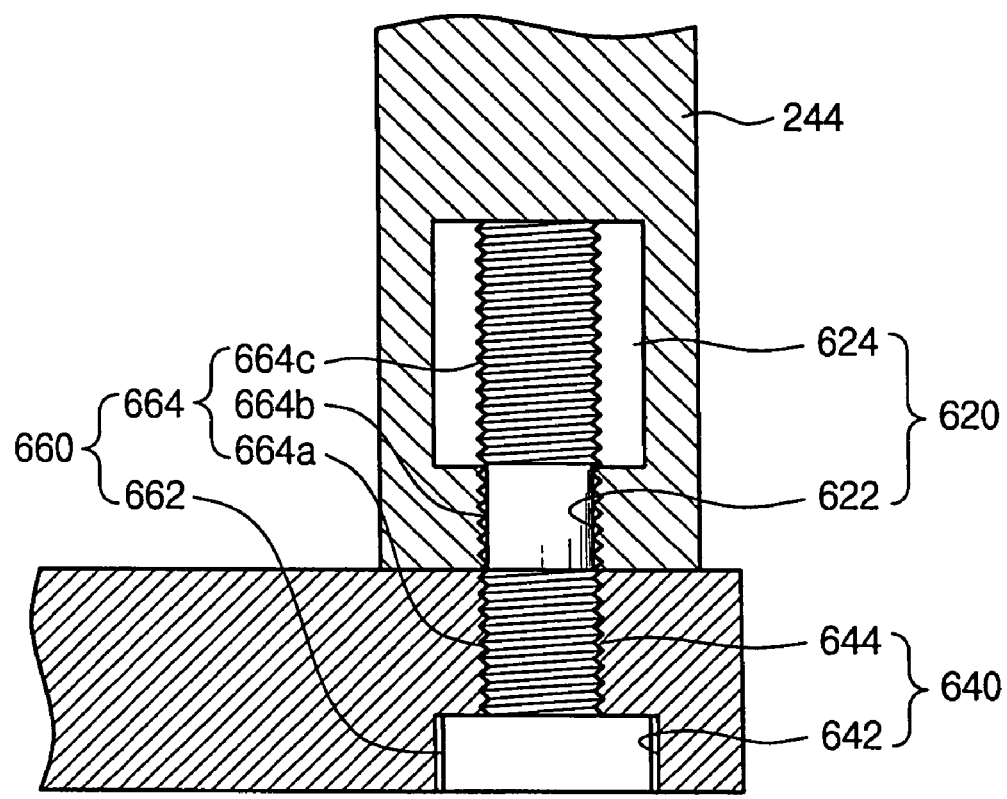
FIG. 10 is an enlarged view of portion (A) of the apparatus shown in FIG. 8.

FIG. 10 shows the coupling between the movable rod 244 and the horizontal rod 262. Referring to FIG. 10, the horizontal rod 262 has a through-hole 640 that includes a lower accommodation portion 642 and an upper threaded portion 644 extending upward from the accommodation portion 642. The accommodation portion 642 receives a head 662 of a screw 660. The movable rod 244 includes a coupling portion 620 that receives the screw 660. The coupling portion has a threaded hole 622 and a cylindrical accommodation cavity 624 into which the threaded hole 622 opens. The threaded hole 622 is formed in an end of the movable rod 244 and is aligned with the threaded portion 644 of the through-hole 640 of the horizontal rod 262. The cylindrical accommodation cavity 624 extends upward from the threaded hole 622 and has a diameter larger than the outer diameter (thread diameter) of the threaded hole 622. The horizontal rod 262 and the movable rod 244 are coupled by the screw 660. The body 664 of the screw 660 includes a first threaded portion 664a adjacent the head 662 of the screw 660, an insertion portion 664b adjacent the first threaded portion 664a, and a second threaded portion 664c adjacent the insertion portion 664b. The insertion portion 664b does not have threads, unlike the first and second threaded portions 664a and 664c. When the horizontal rod 262 and the movable rod 244 are coupled, the head 662 of the screw 660 is disposed in the accommodation portion 642 of the coupling hole 640 of the horizontal rod 262, the first threaded portion 664a of the screw 660 is disposed in and mated to the threaded portion 644 of the through-hole 640 of the horizontal rod 262, the insertion portion 664b of the screw 660 is situated in the threaded hole 622 of the movable rod 244, and the second threaded portion 664c of the screw 660 is disposed in the accommodation cavity 624 of the movable rod 244. Accordingly, the movable rod 244 is coupled to one end of the horizontal rod 262 so as to move therewith but can also rotate about its longitudinal axis relative to the end of the horizontal rod 262.

Referring again to FIG. 8, the driving mechanism 266 of the position adjusting device 260 and the rotating device 300 are accommodated in a housing 420 that is coupled to a lower portion of the shaft 320. The lifting device 400 is coupled to the housing 420 so as to move the housing 420 up and down. The lifting device 400 may include a vertically disposed screw, a motor that rotates the screw, and a nut-like member threaded to the screw. The nut-like member is fixed against rotation relative to the screw so as to be moved vertically by the screw when the screw is rotated. And, the nut-like member is coupled to the housing 420 so that the housing 420, shaft 320 and substrate support 200 move vertically therewith. Alternatively, the lifting device 400 can be coupled to the tub 100 so that the tub 100 can be raised and lowered relative to the substrate support 200.

Referring again to FIGS. 3 and 4, the liquid supply system 500 for supplying cleaning liquid to the wafers (W) includes a chemical solution supply sub-system 520 and a rinsing liquid supply sub-system 540. The chemical solution supply sub-system 520 dispenses chemical solutions such as a hydrofluoric acid solution, a sulfuric acid ($H_2SO_4$) solution, a phosphate solution, or an ammonium salt solution onto the wafers (W). The rinsing liquid supply sub-system 540 dispenses rinsing liquid, such as deionized water, onto the wafers (W).

The chemical solution supply sub-system 520 includes a manifold 522 and nozzles 524 connected to the manifold 522. The manifold 522 is disposed outside the tub 100 at a position close to an outer surface of the tub 100. The manifold 522 is elongated in the vertical direction. A chemical solution supplying line 140 is connected to the manifold 522 to supply chemical solutions from a chemical solution reservoir (not shown) to the manifold 522. A valve 140a is disposed in the chemical solution supplying line 140 to close/open the chemical solution supplying line 140 or adjust the rate at which a chemical solution flows through the chemical solution supplying line 140. Furthermore, a circulating line 160 branches off from the drain tube 120 and connects to the chemical solution supplying line 140. A valve 160a is disposed in the circulating line 160 for opening and closing the circulating line 160.

Thus, a chemical solution discharged from the tub 100 through the drain line 120 can be supplied back into the tub 100 through the recirculating line 160 and the chemical solution supplying line 140. To this end, a pump 162, a filter 164, and a heater 166 are disposed in the circulating line 160. The pump 162 forces the chemical solution from the drain line 120 to the chemical solution supplying line 140, and the filter 164 removes foreign substances from the chemical solution that is being circulated through the tub 100 in this way. The heater 166 heats the chemical solution to a temperature appropriate for the particular cleaning process that is being carried out in the tub 100.

The nozzles 524 extend from the manifold 522 in a horizontal direction. The number of nozzles 524 is equal to the number of wafers (W) that can be disposed in the tub 100 at a time. The nozzles 524 are also spaced from one another along the manifold 522 in a vertical direction. The spacing of the nozzles 524 is equal to the spacing of wafers (W) supported on the substrate support 200. As mentioned previously, the nozzles 524 extend into the tub 100 through holes in the sidewall 112 of the tub 100. The nozzles 524 are oriented such that the chemical solution is ejected from the nozzles 524 toward the centers of the wafers (W). Alternatively, each nozzle 524 can be configured to spray a chemical solution across a wafer (W) from the center to the outer peripheral edge of the wafer (W). Also, although the liquid supply system has been shown and described as having a single chemical solution supply sub-system, one or more additional chemical solution supply sub-systems can be provided to sequentially or selectively dispense different chemical solutions onto wafers (W) in the tub 100.

The rinsing liquid supply sub-system 540 includes a manifold 542 and nozzles 544 connected to the manifold 542. The manifold 542 and the nozzles 544 of the rinsing liquid supply sub-system 540 have substantially the same shapes as the manifold 522 and the nozzles 524 of the chemical liquid supply sub-system 520. A rinsing liquid supplying line 180 is connected to the manifold 542 to supply rinsing liquid from a rinsing liquid reservoir (not shown) to the manifold 542. A valve 180a is disposed in the rinsing liquid supplying line 180 to close/open the rinsing liquid supplying line 180 or adjust the rate at which rinsing liquid flows through the rinsing liquid supplying line 180.

A method of cleaning substrates will now be described with reference to FIGS. 11A through 16. In FIGS. 11A, 12A, 13A, 14, 15, and 16, the shading of the valves 140a and 180b in black designates that the valves 140a and 180a are closed and are thereby blocking the flow of cleaning liquid. On the other hand, when the valves 140a and 180a are and are not shaded the valves are being represented as being open to allow cleaning liquid to flow though the lines in which the valves 140a and 180 are disposed.

Figure 11A:
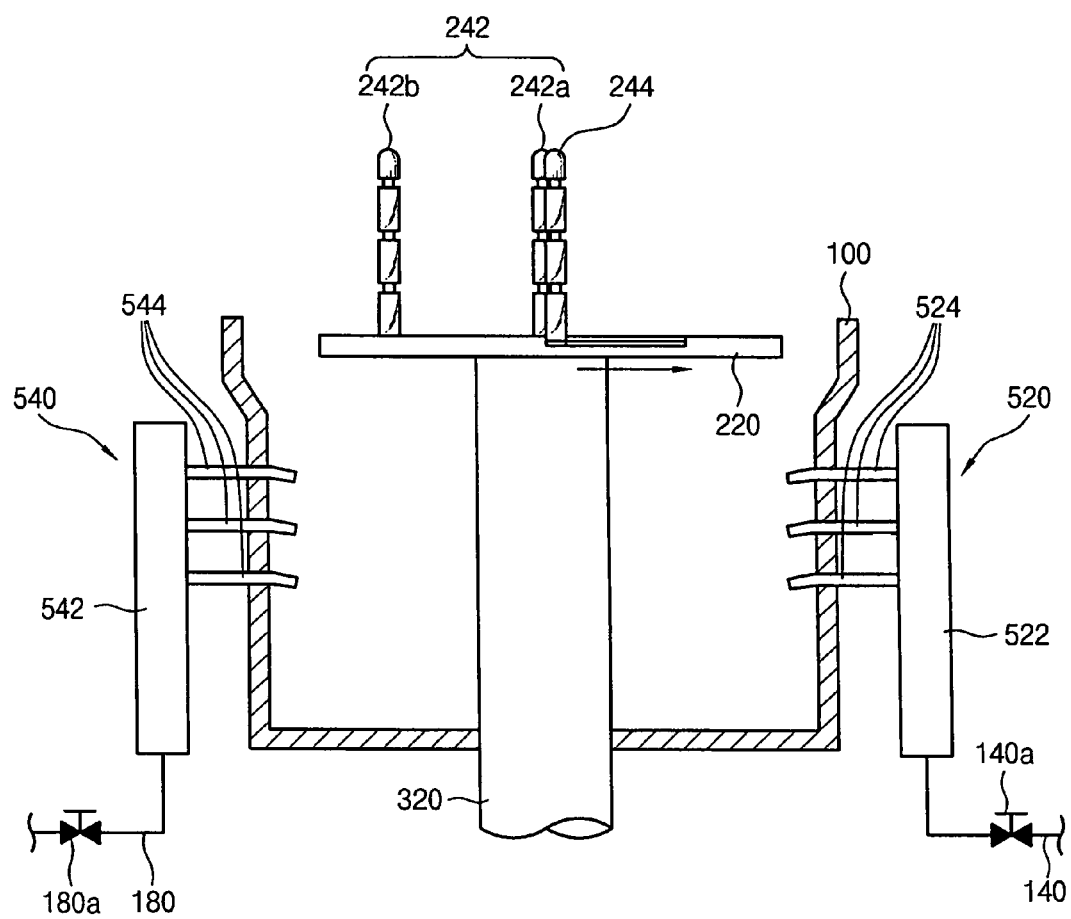
FIGS. 11A, 12A, 13A and 14 through 16 are each a side view, partially in section, of the substrate cleaning apparatus and together illustrate a method of cleaning substrates using the substrate cleaning apparatus according to the present invention.
Figure 11B:
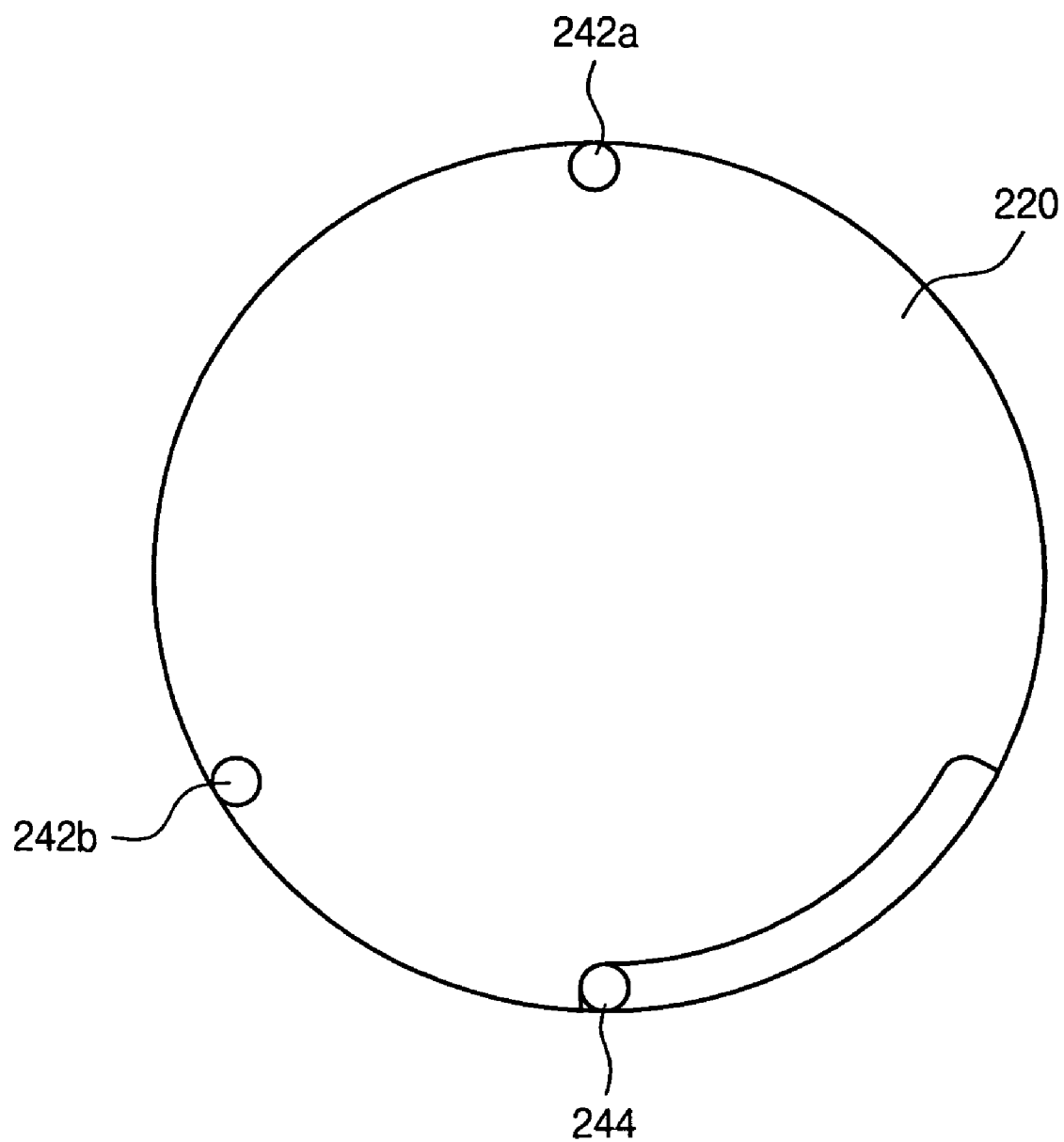
FIGS. 11B, 12B and 13B are plan views of the substrate support shown in FIGS. 11A, 12A and 13A, respectively.
Figure 12A:
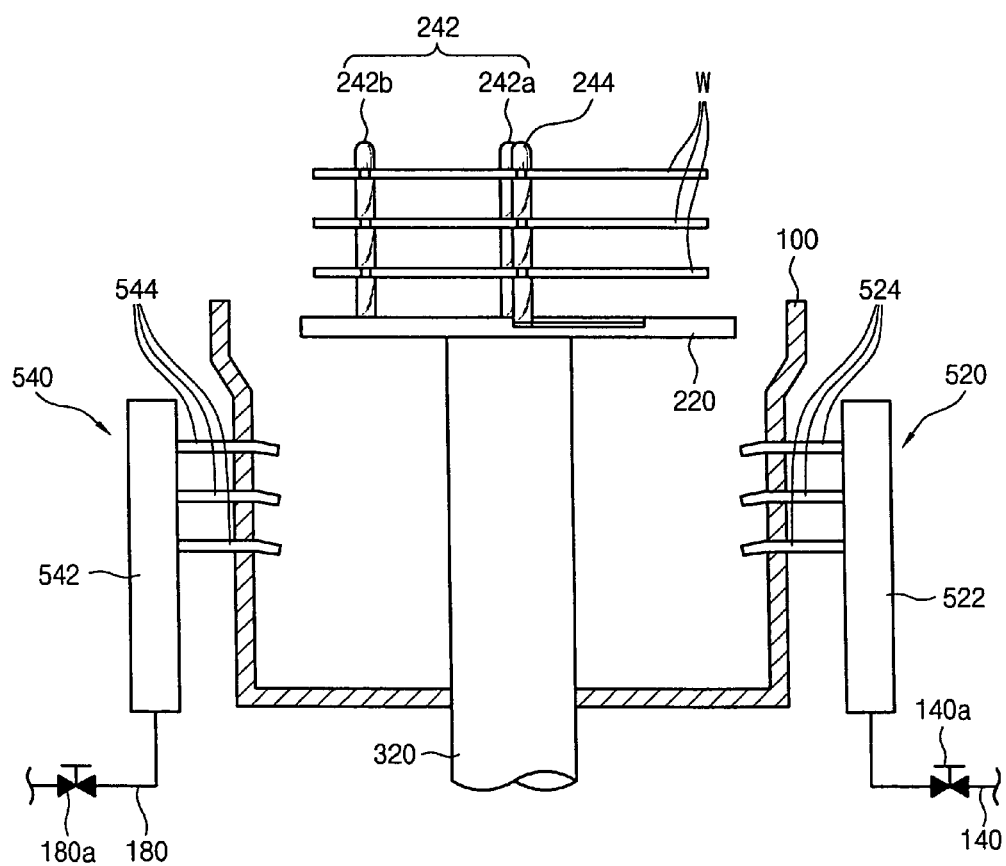
Figure 12B:
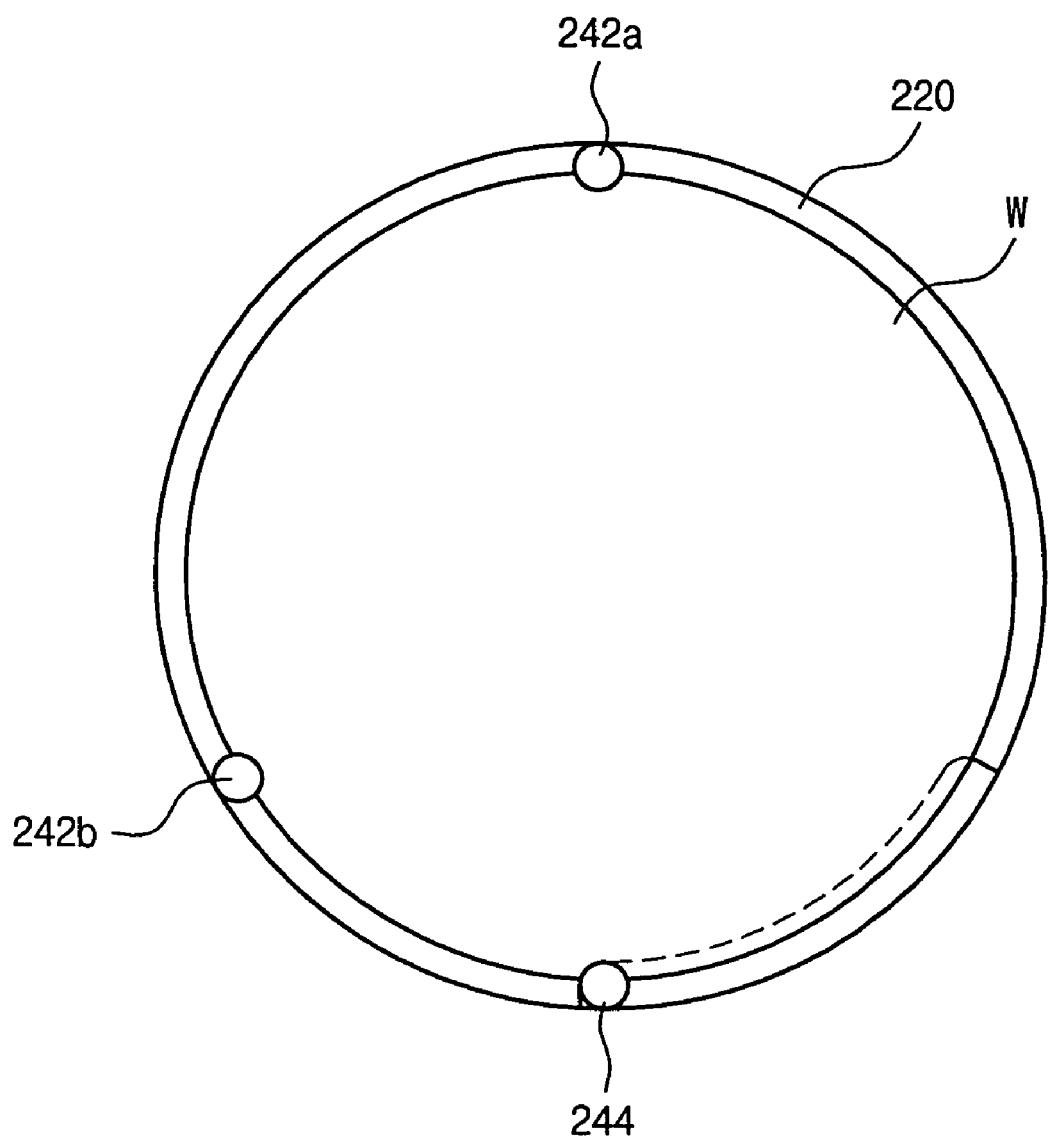

Referring to FIG. 11A, the lifting device 400 raises the substrate support 200 until the grooves 245 in the support rods 240 are completely exposed above the tub 100. At this time, as shown in FIG. 11B, the movable rod 244 is in its open position. Thus, a passage is present between one of the fixed rods 242a and the movable rod 244. The width of this passage is at least equal to the diameter of the wafers (W) to be loaded onto the substrate support 200. Referring to FIGS. 12A and 12B, wafers (W) are placed between the support rods 240 and into the grooves 245 by a transfer robot (not shown) such that the wafers (W) are supported by the support rods 240. The wafers (W) may be placed onto the substrate support 200 one by one or all at one time.

Figure 13A:
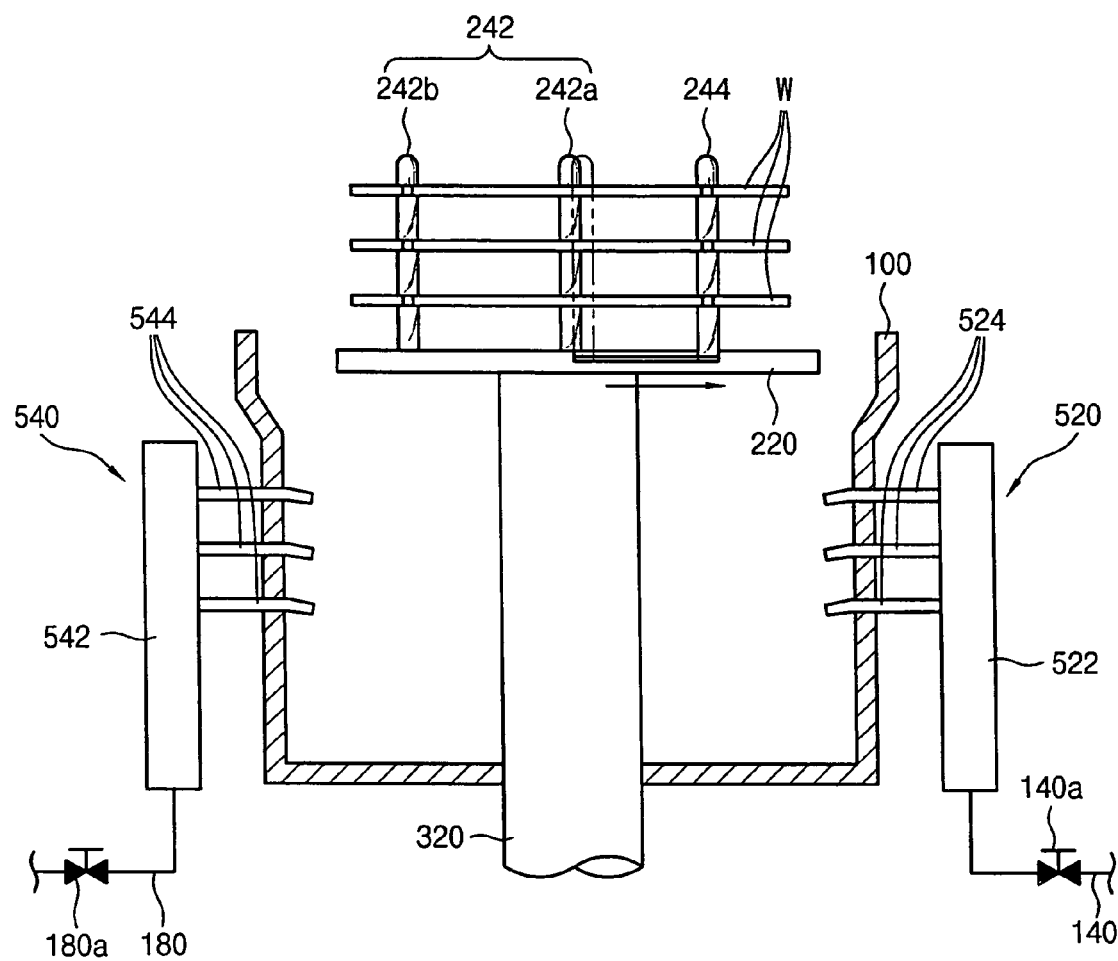
Figure 13B:
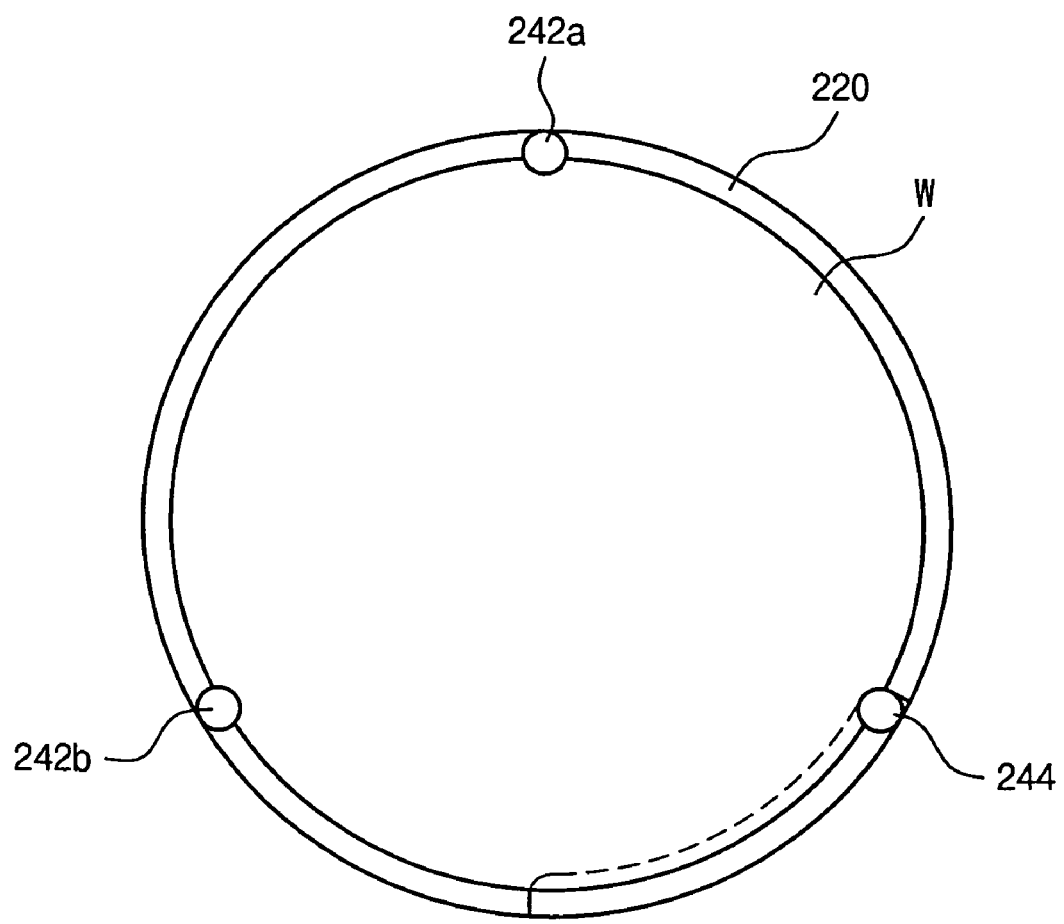
Figure 14:
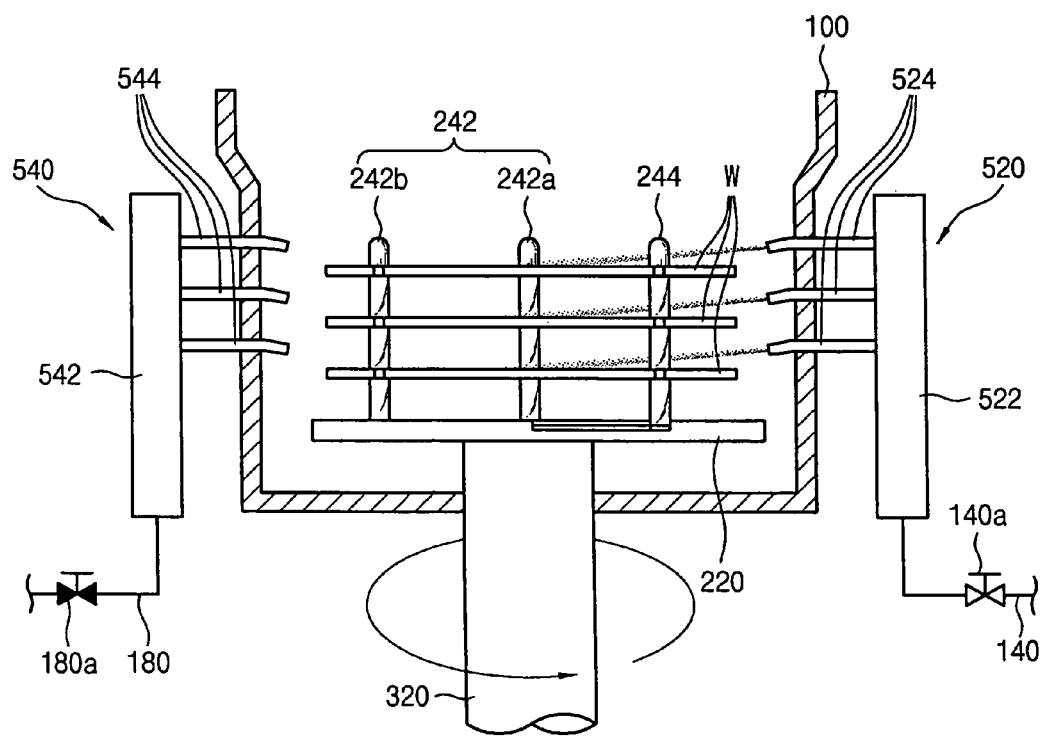
Figure 15:
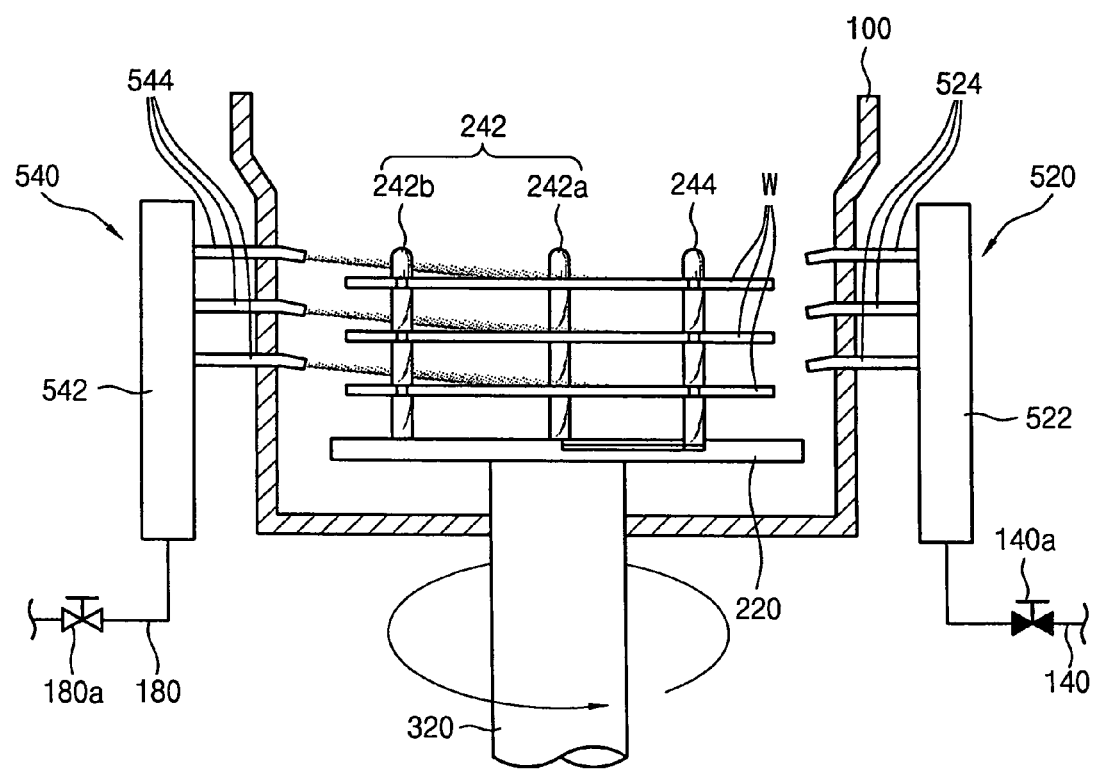
Figure 16:
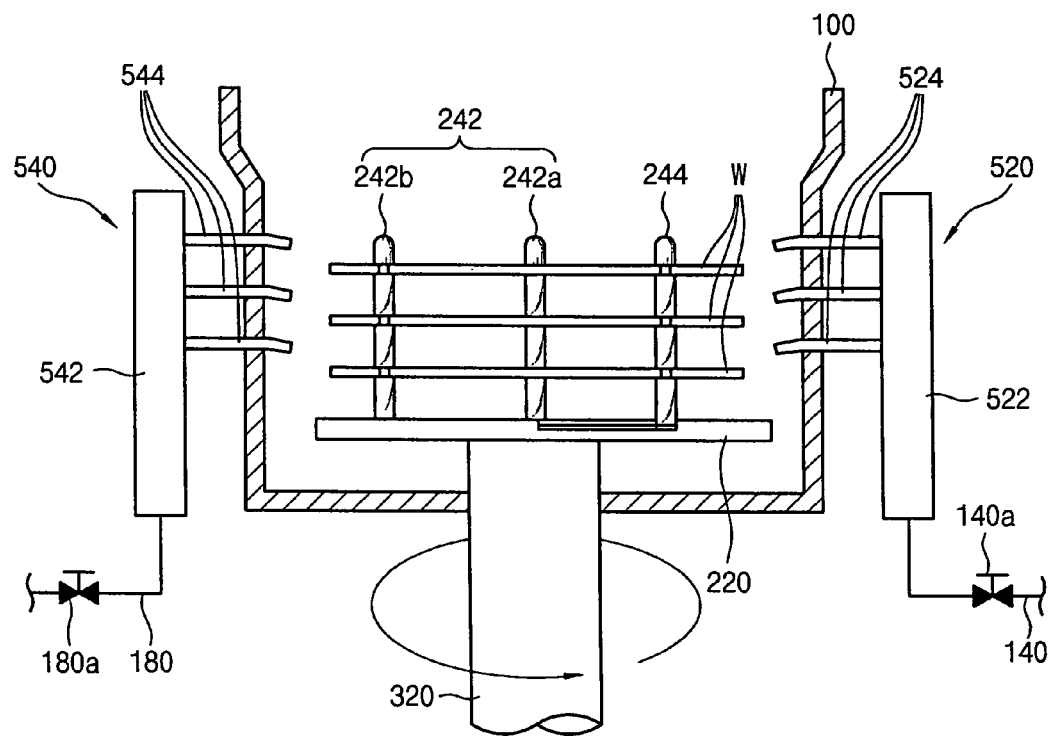

Referring to FIGS. 13A and 13B, the movable rod 244 is moved to its closed position to prevent the wafers (W) from falling from the support rods 240. That is, the width of the passage between the fixed rod 242a and the movable rod 244 is thus reduced to a value less than the diameter of the substrates. Hence, the wafers (W) are confined between the support rods 240. Next, the substrate support 200 is lowered to dispose the wafers (W) in the tub 100. In this state, the wafers (W) are chemically treated to remove films, organic substances, or contaminants from the wafers (W). More specifically, as shown in FIG. 14, the substrate support 200 which holds the wafers (W) is rotated, and the valve 140a of the chemical solution supplying line 140 is opened to cause chemical solution to be dispensed onto the wafers (W) by the nozzles 524. A rinse is performed after the chemical solution treatment to remove the chemical solution from the wafers (W). More specifically, referring to FIG. 15, the substrate support 200 which holds the wafers (W) is rotated, and the valve 180a in the rinsing liquid supplying line 180 is opened to cause rinsing liquid to be dispensed onto the wafers (W) by the nozzles 544. A drying operation is performed after the rinsing operation to dry the wafers (W). More specifically, referring to FIG. 16, the rotating device 300 rotates the substrate support 200 at a high speed to remove the rinsing liquid from the wafers (W) by centrifugal force.

As described above, according to the present invention, a plurality of wafers can be individually cleaned at one time. Therefore, the productivity of the overall manufacturing process is not impeded by the cleaning process, and yet each wafer is cleaned efficiently and effectively.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments are within the true spirit of the invention whose scope shall be determined by the appended claims according to the maximum extent allowed for by law.

What is claimed is:

1. An apparatus for cleaning substrates, comprising:
   a substrate support including a base plate, at least three support rods extending upright over the base plate to support a plurality of substrates horizontally as spaced vertically one above the other, and a position adjusting device,
   wherein the base plate has an upper surface and a groove extending in the upper surface in an arc along the outer periphery of the upper surface,
   the support rods comprise at least one fixed rod fixed to the base plate, and at least one movable rod disposed in the groove, and
   the position adjusting device comprises a horizontal rod extending in a radial direction of the base plate and having one end to which the movable rod is coupled, a vertical rod fixed to the horizontal rod at the other end thereof, and a driving mechanism operatively operatively connected to the vertical rod so as to rotate the vertical rod about its longitudinal axis and thereby move the movable rod along the groove in the upper surface of the base plate between an open position at which a passage between two of the support rods is wider than a diameter of substrates and a closed position at which the passage is narrower than the diameter,
   whereby substrates having said diameter can be inserted, as oriented horizontally, between said two of the support rods when the at least one movable rod is in the open position thereof and substrates having said diameter and supported by the substrate support are confined between the support rods when the at least one movable rod is in the closed position thereof;
   a rotating device having a vertical cylindrical shaft through which the vertical rod of the position adjusting device extends and whose longitudinal axis is coincident with that of the vertical rod such that the vertical cylindrical shaft and the vertical rod are concentric, and a driving unit,
   wherein the vertical cylindrical shaft is connected to the base plate of the substrate support, and the driving unit is operatively connected to the vertical cylindrical shaft so as to rotate the vertical cylindrical shaft about its longitudinal axis and thereby rotate the base plate of the substrate support about an axis coincident with the longitudinal axis of the vertical rod; and
   a liquid supply system that dispenses cleaning liquid onto all of the substrates supported by the substrate support.

2. The apparatus of claim 1, wherein each of the fixed and movable rods has a plurality of grooves spaced along the length of the rod for receiving outer peripheral portions of substrates.

3. The apparatus of claim 2, wherein each of the grooves is annular.

4. The apparatus of claim 1, wherein the movable rod is coupled to said one end of the horizontal rod so as to be freely rotatable about a vertical axis relative to said one end of the horizontal rod.

5. The apparatus of claim 1, wherein the base plate has a sector-shaped guide opening in which the horizontal rod is disposed, the sector-shaped guide portion opening being delimited by two walls of the base plate extending in radial directions of the base plate, respectively, and opening into the groove in the upper surface of the base plate, whereby the range over which the horizontal rod can be rotated is restricted to the angle subtended by the two walls.

6. The apparatus of claim 1, wherein the at least one movable rod consists of one movable rod, and the movable rod is disposed diametrically across from one of the fixed rods with respect to the center of the base plate when the movable rod is in the open position.

7. The apparatus of claim 1, wherein the at least one movable rod consists of one movable rod, and the fixed rods and the movable rod are spaced from one another by equiangular intervals when the movable rod is in the closed position.

8. The apparatus of claim 1, wherein the liquid supply system has a plurality of nozzles disposed at different heights, the nozzles being oriented to respectively eject cleaning liquid toward locations where the centers of substrates supported by the substrate support are located.

9. The apparatus of claim 1, further comprising:
   a tub; and
   a lifting device operatively connected to one of the substrate support and the tub so as to move the substrate support and the tub vertically relative to each other.

10. The apparatus of claim 9, wherein the liquid supply system further comprises a manifold disposed outside the tub, and wherein the nozzles extend from the manifold into the tub.

11. The apparatus of claim 1, wherein the liquid supply system comprises:
   at least one chemical solution supply sub-system that supplies a chemical solution onto all of the substrates supported by the substrate support; and
   at least one rinsing liquid supply system that supplies rinsing liquid onto all of the substrates supported by the substrate support, and
   wherein the chemical solution supply sub-system includes a plurality of nozzles that direct chemical solution onto all of the substrates supported by the substrate support, and the rinsing liquid supply sub-system includes a plurality of nozzles that direct the rinsing liquid onto all of the substrates supported by the substrate support.

* * * * *